US008658464B2

(12) United States Patent
Cheng et al.

(10) Patent No.: US 8,658,464 B2
(45) Date of Patent: Feb. 25, 2014

(54) MOLD CHASE DESIGN FOR PACKAGE-ON-PACKAGE APPLICATIONS

(75) Inventors: Jung Wei Cheng, Hsin-Chu (TW); Chien-Hsiun Lee, Chu-Tung Town (TW); Tsung-Ding Wang, Tainan (TW); Chun-Chih Chuang, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/298,086

(22) Filed: Nov. 16, 2011

(65) Prior Publication Data
US 2013/0119549 A1 May 16, 2013

(51) Int. Cl.
*H01L 21/00* (2006.01)

(52) U.S. Cl.
USPC ............. 438/106; 438/15; 438/118; 257/778; 257/787

(58) Field of Classification Search
None
See application file for complete search history.

(56) References Cited

U.S. PATENT DOCUMENTS

| | | | |
|---|---|---|---|
| 2009/0057918 A1* | 3/2009 | Kim | 257/777 |
| 2009/0093087 A1* | 4/2009 | Murakami et al. | 438/113 |
| 2011/0062602 A1* | 3/2011 | Ahn et al. | 257/787 |

* cited by examiner

*Primary Examiner* — Julio J Maldonado
*Assistant Examiner* — Joseph Galvin, III
(74) *Attorney, Agent, or Firm* — Slater & Matsil, L.L.P.

(57) ABSTRACT

A method includes placing a mold chase over a bottom package, wherein the bottom package has a connector at a top surface of the bottom package. The mold chase includes a cover, and a pin under and connected to the cover. The pin occupies a space extending from a top surface of the connector to the cover. A polymer is filled into a space between the cover of the mold chase and the bottom package. The polymer is then cured. After the step of curing the polymer, the mold chase is removed, and the connector is exposed through an opening in the polymer, wherein the opening is left by the pin of the mold chase.

18 Claims, 9 Drawing Sheets

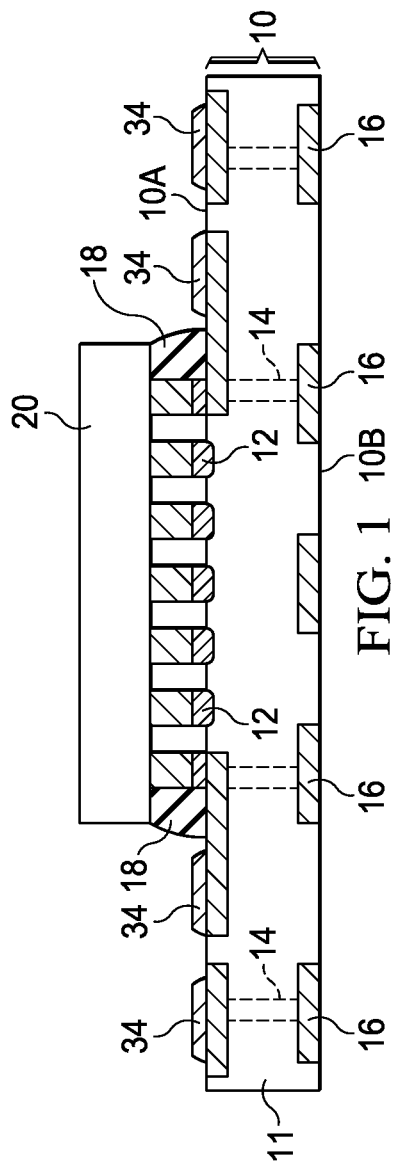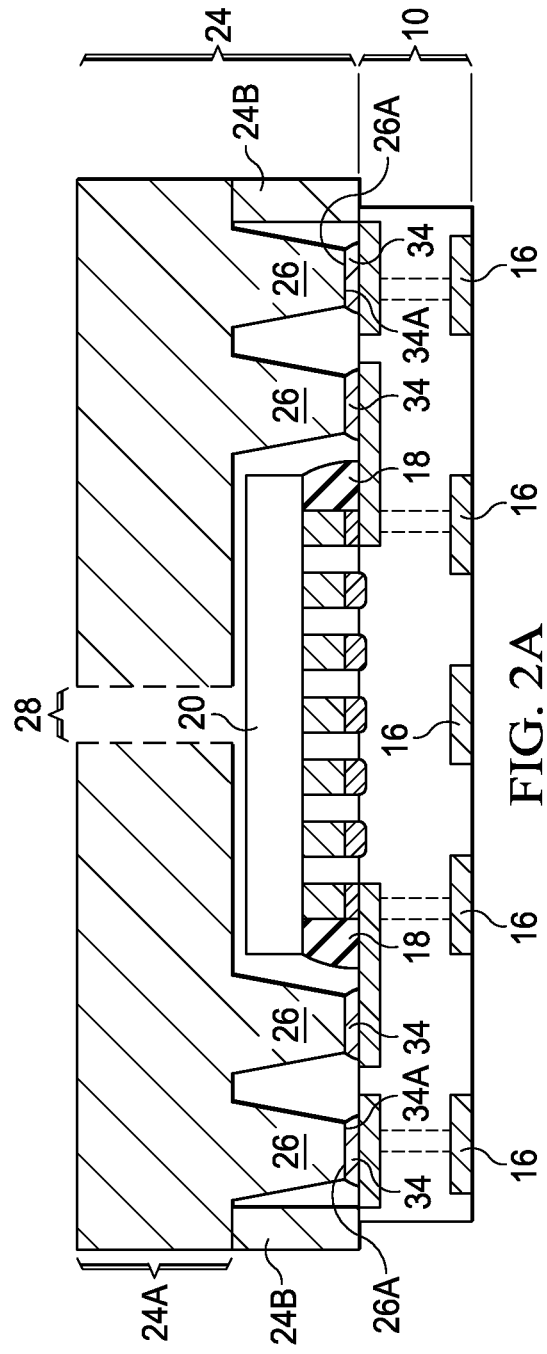
FIG. 1
FIG. 2A

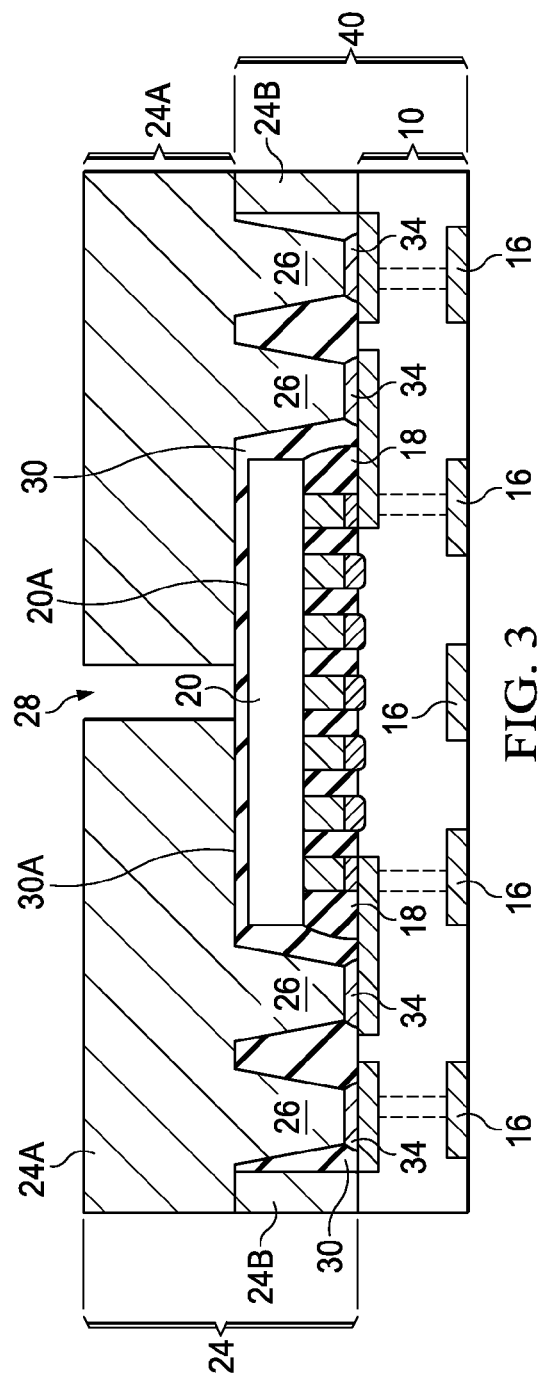
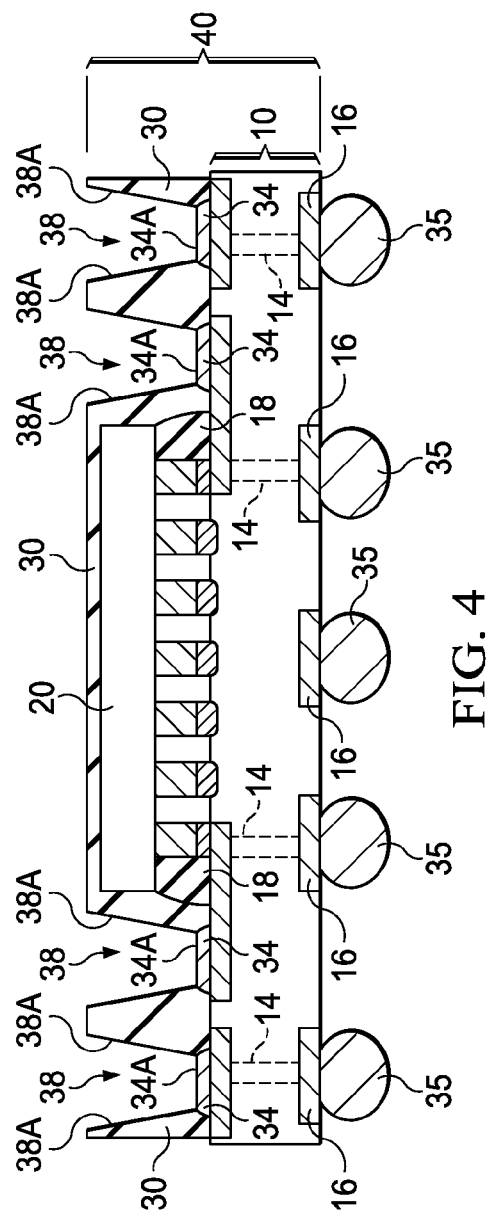
FIG. 3
FIG. 4

MOLD CHASE DESIGN FOR PACKAGE-ON-PACKAGE APPLICATIONS

BACKGROUND

In a conventional package-on-package (POP) process, a top package, in which a first device die is bonded, is bonded to a bottom package. The bottom package may also have a device die packaged therein. By adopting the PoP process, the integration level of the packages may be increased.

In a typical PoP process, a bottom package is formed first, which comprises a device die bonded to a package substrate. A molding compound is then molded on the package substrate, wherein the device die is molded in the molding compound. The package substrate further comprises connectors that are on the same side of the package substrate as the device die. The connectors are used for connecting the bottom package to a top package. Through-molding openings are formed in the molding compound, so that the connectors are exposed through the Through-molding openings. The top package may then be bonded to the bottom package through the connectors.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 5 are cross-sectional views and top views of intermediate stages in the manufacturing of a package in accordance with various embodiments;

DETAILED DESCRIPTION OF ILLUSTRATIVE EMBODIMENTS

Figure 2B:
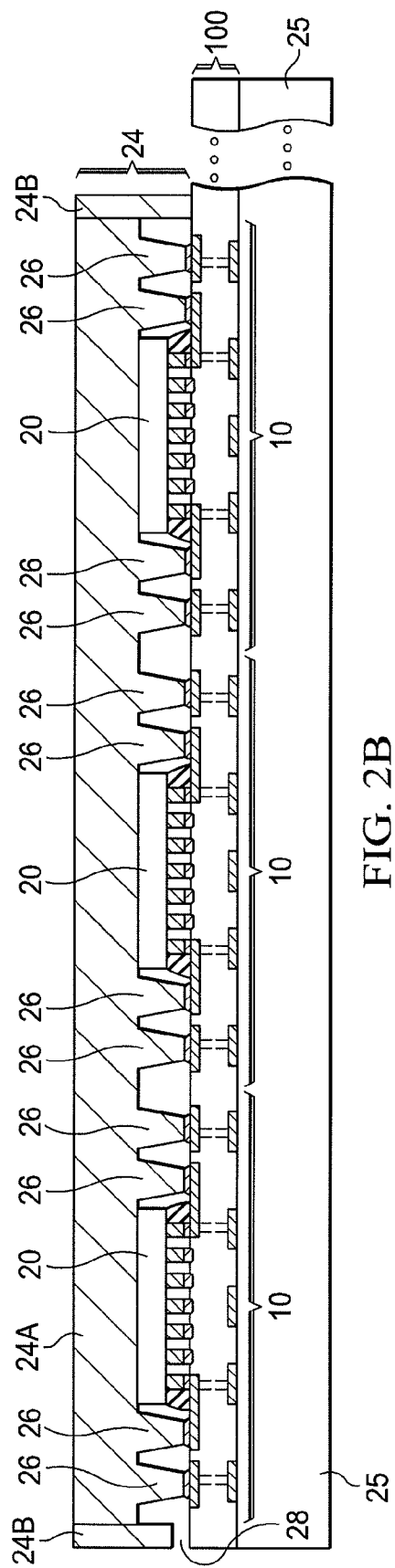

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A package and the method of forming the same are provided in accordance with various embodiments. The intermediate stages of forming the packages are illustrated. The variations of the embodiments are discussed. Throughout the various views and illustrative embodiments, like reference numbers are used to designate like elements.

Referring to FIG. 1, package component 10 is provided. In an embodiment, package component 10 is an interposer. In alternative embodiments, package component 10 is a package substrate. Package component 10 may comprise substrate 11 that is formed of a semiconductor material, such as silicon, silicon germanium, silicon carbon, gallium arsenide, or other commonly used semiconductor materials. Alternatively, substrate 11 is formed of a dielectric material. Substrate 11 may also be a laminate substrate which includes laminated dielectric films. Package component 10 is configured to electrically couple connectors 12 on first surface 10A to conductive features 16 on second surface 10B, wherein surfaces 10A and 10B are opposite surfaces of package component 10. Conductive features 16 may be metal pads, for example. Package component 10 may include metal lines/vias 14 therein. Alternatively, features 14 are through-vias penetrating through substrate 11.

Package component 20 is bonded to package component 10 through connectors 12. Package component 20 may be a die, and hence is alternatively referred to as die 20 herein after, although it may also be another type of package component such as a package. Die 20 may be a device die comprising integrated circuit devices, such as transistors, capacitors, inductors, resistors (not shown), and the like. The bonding of die 20 to connectors 12 may be a solder bonding or a direct metal-to-metal bonding (such as copper-to-copper bonding). Underfill 18 may be dispensed into the gaps between die 20 and package component 10.

Connectors 34 are formed on the top surface of package component 10. Connectors 34 may be electrically coupled to connectors 12 and conductive features 16. In some embodiments, connectors 34 may be metal pads. Alternatively, connectors 34 may comprise solder balls, solder caps formed on metal pillars, or the like. Connectors 34 are not covered by die 20. Connectors 34 may extend above, or may be substantially level with, top surface 10A of package component 10.

Referring to FIG. 2A, upper mold chase 24 is placed on, and is pressed against package component 10, for example, through clamping. In an embodiment, mold chase 24 includes pins 26 that extend down to contact, and pressed on, connectors 34, wherein pins 26 may be identical to each other. Pins 26 are designed to align to connectors 34, so that each of connectors 34 has one of overlying pins 26. The number of pins 26 may be equal to the total number of connectors 34. The bottom surfaces 26A of pins 26 are in contact with top surfaces 34A of connectors 34. In some embodiments, connectors 34 comprise solder regions as top portions, wherein top surfaces 34A of the solder regions may be pressed (coined) before mold chase 24 is placed on, and hence may be substantially flat. Alternatively, mold chase 24 is pressed against connectors 34 so that top surfaces 34A, which may be round due to the reflow, are flattened by pins 26.

Mold chase 24 includes cover 24A, and edge portions 24B for withholding the molding compound that will be molded in subsequent steps. Mold chase 24 may be formed of stainless steel, ceramics, copper, aluminum, or other type of materials. In the embodiments shown in FIG. 2A, the molding is at die-scale, wherein each of package component 10 and the overlying die 20 is molded separately from the molding of other package components (that are in the same strip or wafer) and the respective overlying dies. In these embodiments, opening 28 may be formed in mold chase 24 for injecting molding compound.

In alternative embodiments, as shown in FIG. 2B, the molding is at the strip scale or wafer scale, wherein a plurality of package components 10 and the overlying dies are molded simultaneously. For example, in FIG. 2B, a lower mold chase 25 is provided, and is placed under package substrate strip 100 (which may alternatively be a wafer). Package substrate strip 100 may include a plurality of package components 10.

Figure 2D:
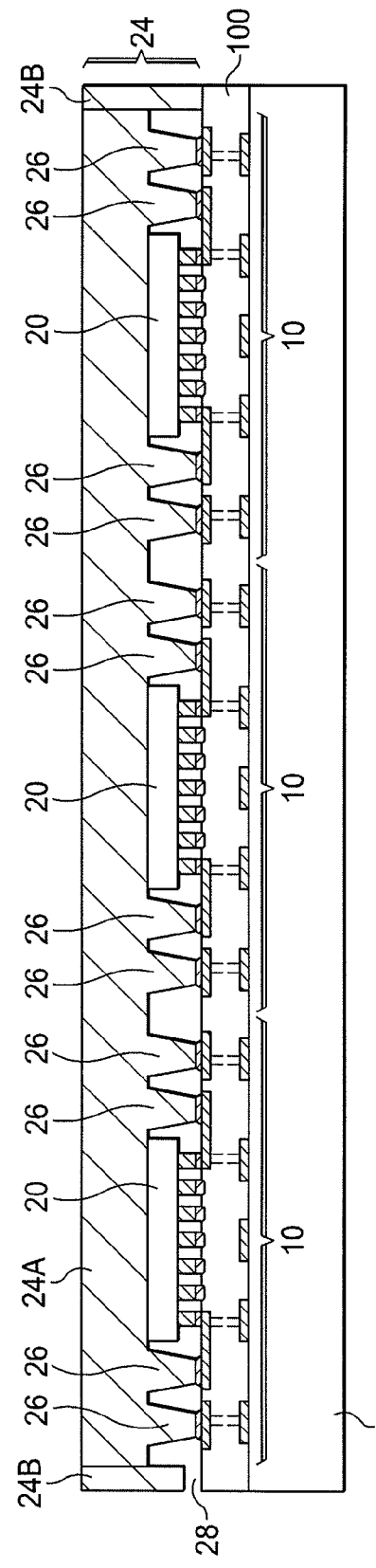
Figure 2C:
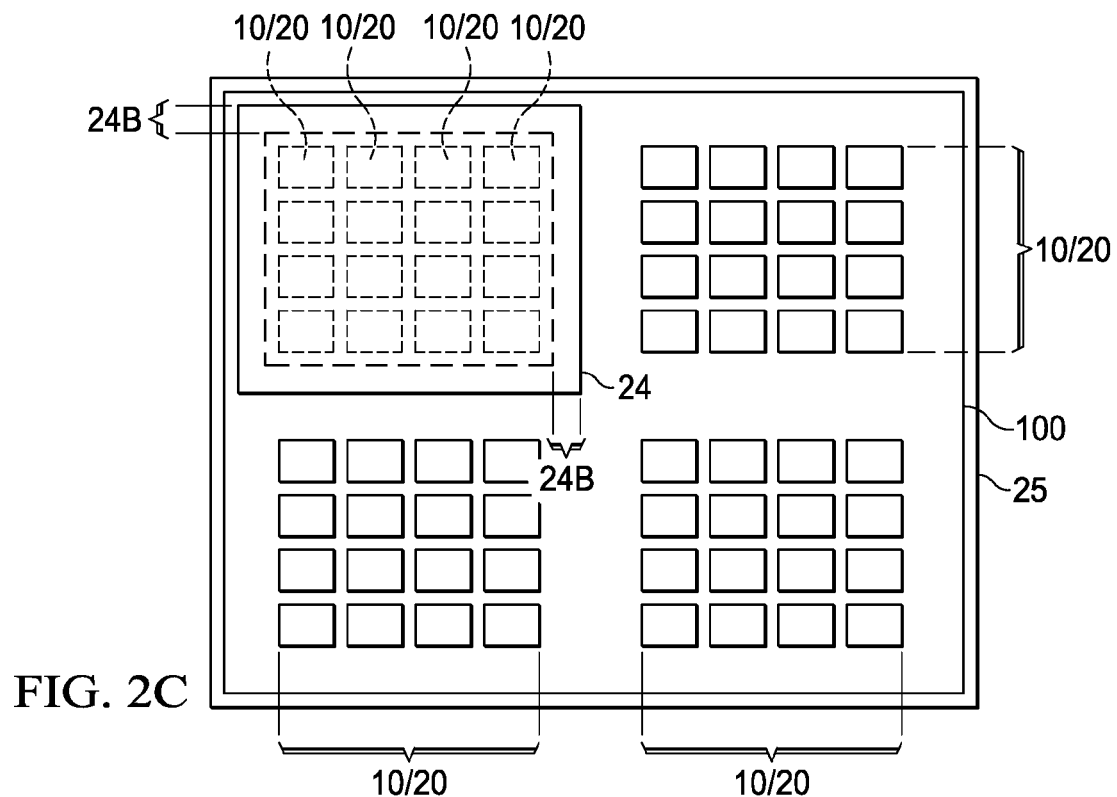
Figure 2E:
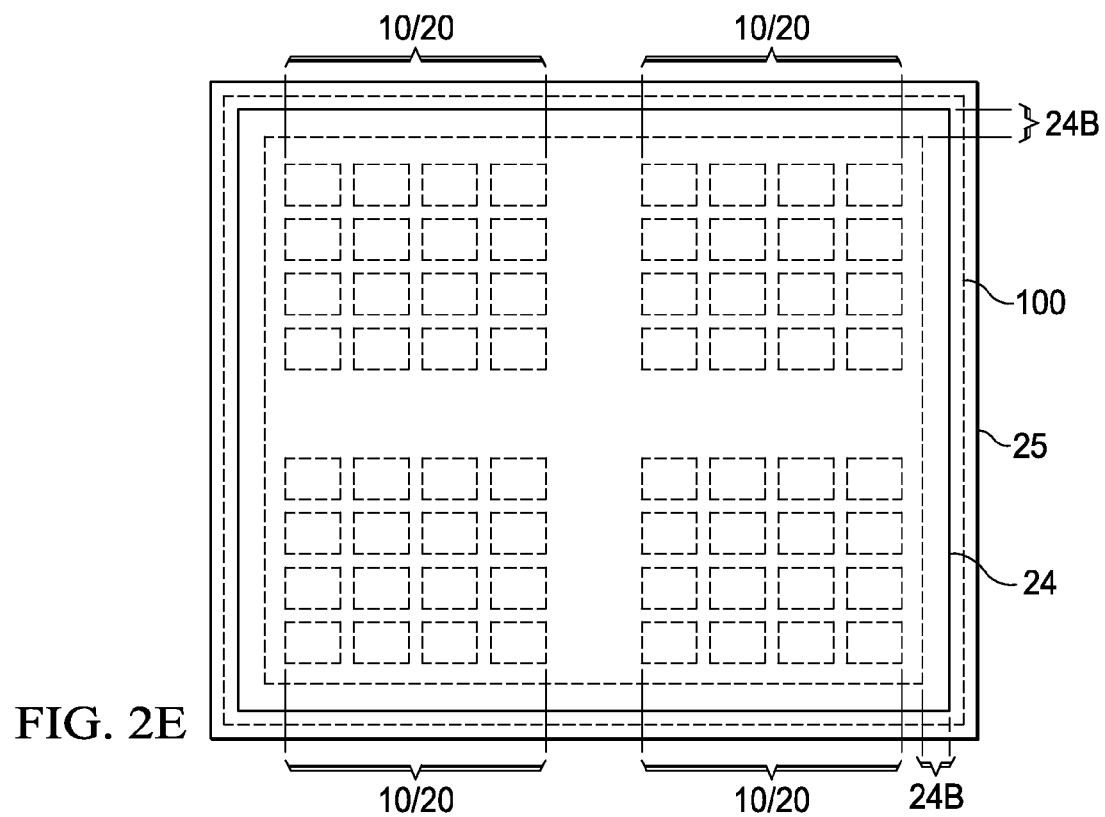

Each of package components 10 has one of device dies 20 bonded thereon. Mold chase 24 (which is an upper mold chase in these embodiments) and lower mold chase 25 substantially seal a plurality of package components 10 in a space. Opening 28 may be formed in edge portion 24B of mold chase 24 for injecting the molding compound into the space. FIG. 2C illustrates a top view of the structure shown in FIG. 2B. As shown in FIGS. 2B and 2C, a block (such as one quarter) of package substrate strip 100 may be molded each time, and it takes a plurality of molding processes to mold the entire package substrate strip 100. In other embodiments, an entirety of package substrate strip 100 may be molded in a single molding process. For example, FIGS. 2D and 2E illustrate embodiments wherein all package components 10 are located in the space defined by upper mold chase 24 and lower mold chase 25. As a result, the molding compound injected into the space through opening 28 may spread to mold the entire package substrate strip 100. In these embodiments, the molding compound may also be injected through opening 28, which is in edge portion 24B. FIG. 2E illustrates a top view of the structure shown in FIG. 2D. It is noted that the embodiments shown in FIGS. 2A through 2E are merely exemplary embodiments that are schematically illustrated.

Referring to FIG. 3, polymer 30 is injected through opening 28 into the space defined by mold chase 24 as in FIGS. 2A through 2C (and mold chase 25 as in FIGS. 2B through 2E). Polymer 30 is in a liquid form and flows. In an exemplary embodiment, polymer 30 comprises a molding compound, and hence is referred to as molding compound 30 hereinafter, although it may also be formed of other materials such as Molding Underfill (MUF), an epoxy, or the like. Molding compound 30 may be in contact with the top surface and the edges of die 20, and may be in contact with and pins 26 and the top surface of package component 10. Top surface 30A of molding compound 30 may be higher than top surface 20A of die 20, and die 20 may be fully encapsulated in molding compound 30. Molding compound 30 is then cured, for example, in a thermal curing process, although other curing methods may be used. Mold chases 24 and 25 may then be taken away, and the molding process is finished. The resulting structure is referred to as bottom package 40 hereinafter.

In FIG. 4, after the removal of mold chase 24, openings 38 are left wherein pins 26 are located, and the top surfaces 34A of connectors 34 are exposed. Openings 38 may have substantially a same size and substantially a same shape as each other. It is realized that for mold chase 24 to be removable, pins 26 (FIG. 3) and openings 38 may either have a vertical profile, or have a tapered profile, with the lower portions of pins 26 have horizontal dimensions (width) smaller than the horizontal dimensions of the upper portions of pins 26. Also, pins 26 and openings 38 may have symmetrical profiles that are either rotational symmetric (in the top view), or symmetric with relative to a plane or planes crossing middle lines of pins 26 and openings 38. Furthermore, the sidewalls 38A of openings 38 are smooth, and may have a roughness smaller than about 2 µm.

As also shown in FIG. 4, connectors 35 are formed on conductive features 16, and hence may be electrically coupled to connectors 12 through the connections such as metal lines/vias 14. Connectors 35 and die 20 may be on opposite sides of package component 10. Connectors 34 may be solder balls, which are placed on conductive features 16. A reflow is performed on solder balls 35. The formation of bottom package 40, which is also referred to as a package component, is thus formed.

Figure 5:
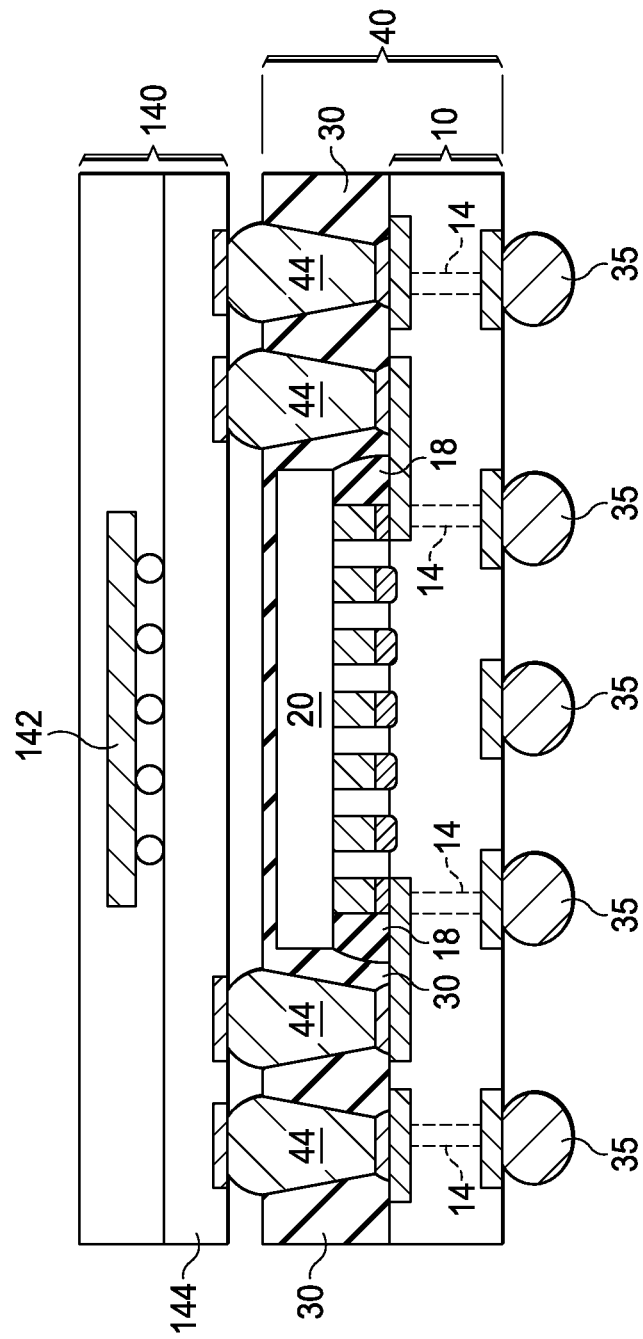

FIG. 5 illustrates the bonding of package components 40 and 140, wherein connectors 44 are formed in openings 38 to connect package component 40 to package component 140. Package component 140 may be a package including device die 142 bonded to package component 144, which may be an interposer or a package substrate. Alternatively, package component 140 may be a device die. Package component 140 may include pre-solder regions (not shown, merged into solder regions 44) that are formed at the bottom surface. Package component 140 may be aligned to package component 40, with the pre-solder regions aligned to, and inserted into openings 38. A reflow is then performed to form solder regions 44, which join package component 40 to package component 140. Solder regions 44 also electrically couple devices and conductive features in package component 40 to devices and conductive features in package component 140.

Figure 6:
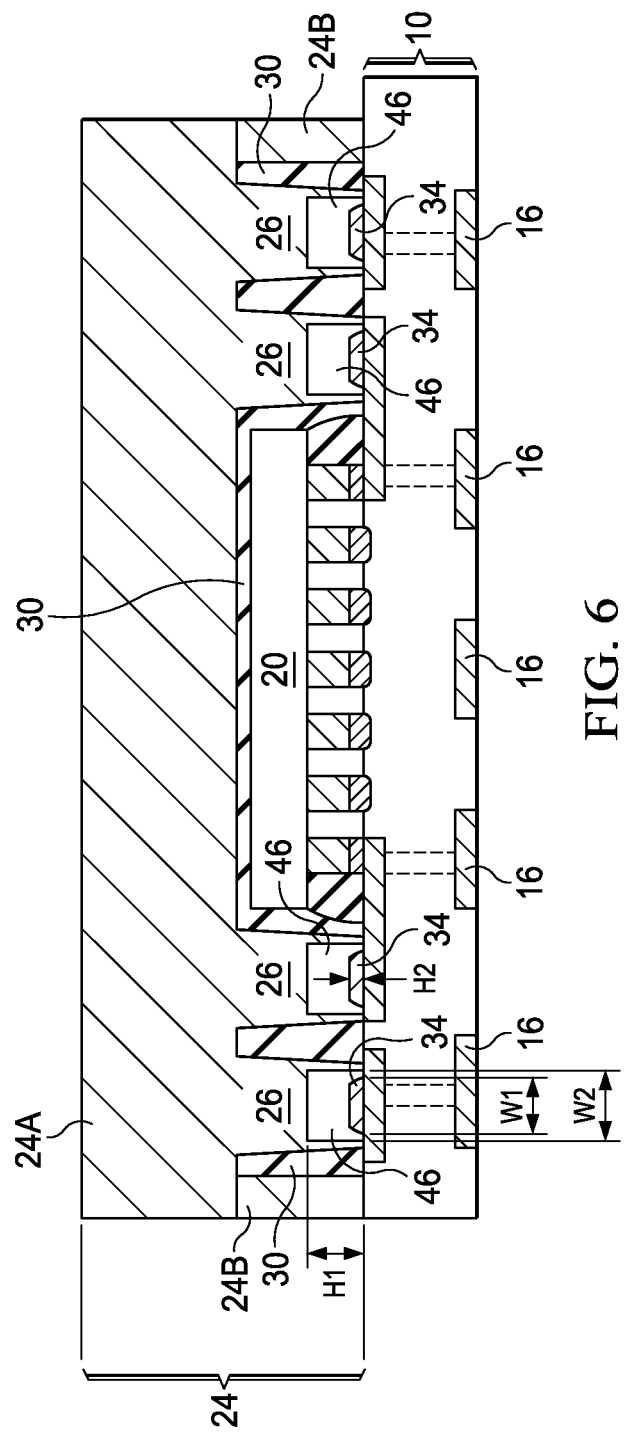
FIG. 6 illustrates a cross-sectional view of an intermediate stage in the manufacturing of a package in accordance with alternative embodiments, wherein a pin, which is a part of a mold chase, has a recess for holding a connector of an underlying bottom package.
Figure 7A:
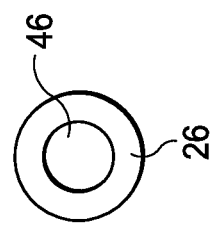
FIGS. 7A and 7B illustrate a cross-sectional view and a bottom view, respectively, of the pin shown in FIG. 6.
Figure 7B:
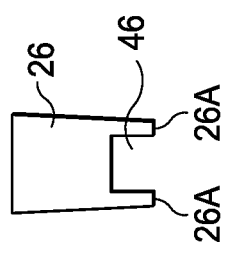

In the embodiments as shown in FIGS. 2A through 2E, pins 26 are in contact with top surfaces 34A of connectors 34. In alternative embodiments, as shown in FIG. 6, pins 26 are hollow, with recesses 46 formed therein. FIGS. 7A and 7B illustrate a cross-sectional view and a bottom view, respectively, of pin 26. Referring to FIG. 7A, recess 46 extends from bottom surface 26A into pin 26. In FIG. 7B, it is shown that recess 46 may have a circular bottom view shape. Alternatively, recess 46 may have one of other bottom-view shapes such as a square, a hexagon, an octagon, or the like. Height H1 (FIG. 6) of recess 46 is greater than height H2 of connectors 34, and horizontal dimension W2 of recess 46 is greater than horizontal dimension W1 of connectors 34, so that connectors 34 may be fully encircled by pins 26, and hence molding compound 30 will be separated from connectors 34.

Figure 9A:
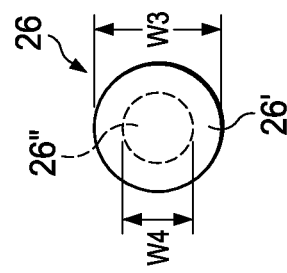
FIGS. 9A and 9B illustrate a cross-sectional view and a bottom view, respectively, of the pin shown in FIG. 8.
Figure 9B:
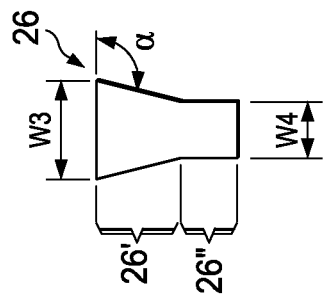
Figure 8:
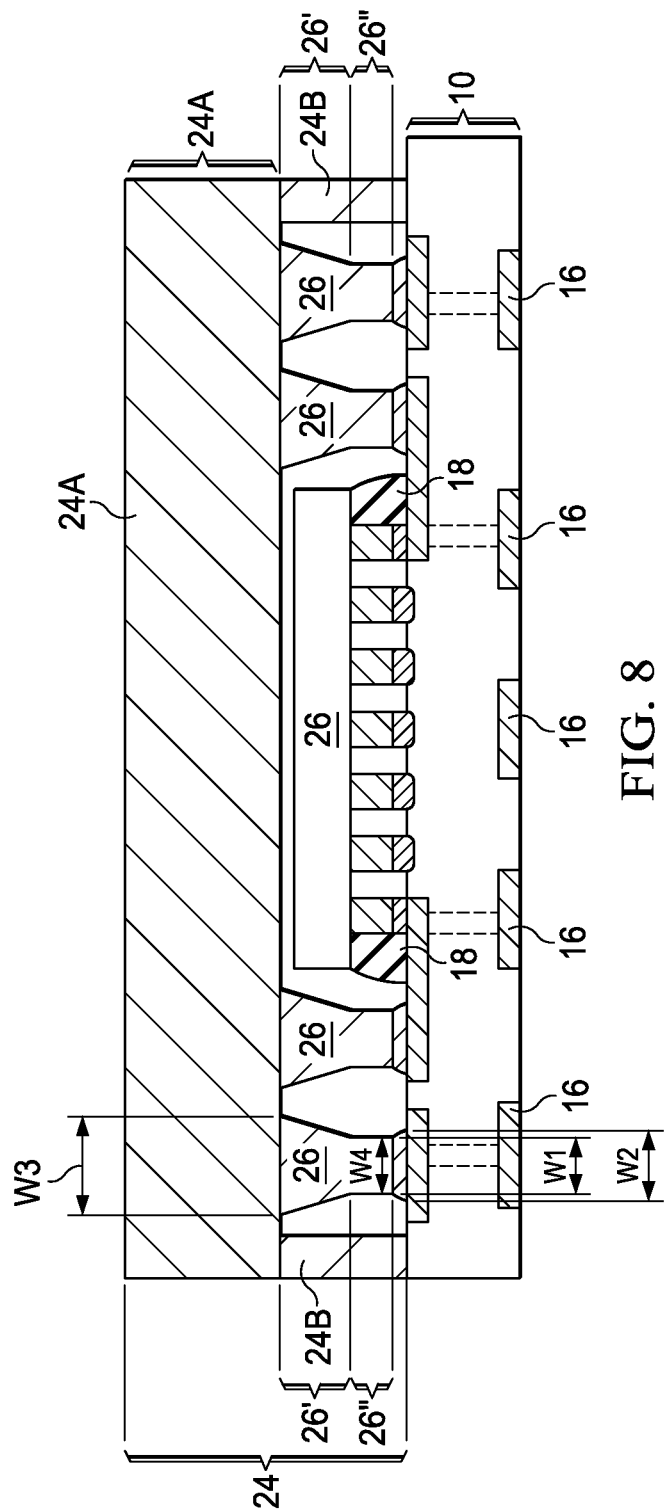
FIG. 8 illustrates a cross-sectional view of an intermediate stage in the manufacturing of a package in accordance with alternative embodiments, wherein a pin as a part of a mold chase includes a tapered portion and a vertical portion.

FIG. 8 illustrates an alternative embodiment, wherein pins 26 includes upper portions 26' that have a tapered profile and slanted sidewalls, and lower portions 26" that have substantially vertical sidewalls. FIG. 9A illustrates a cross-sectional view of the respective pin 26. The sidewalls of portions 26' may be substantially straight, with slant angle $\alpha$ being greater than about 90 degrees, for example. Horizontal dimension W3 of the upper portion 26' is greater than horizontal dimension W4 of lower portion 26", for example, by about 10 µm. Furthermore, horizontal dimension W4 of lower portions 26" may be equal to or greater than horizontal dimension W1 of connectors 34 (FIG. 8). FIG. 9B illustrates a bottom view of the respective pin 26.

Figure 10:
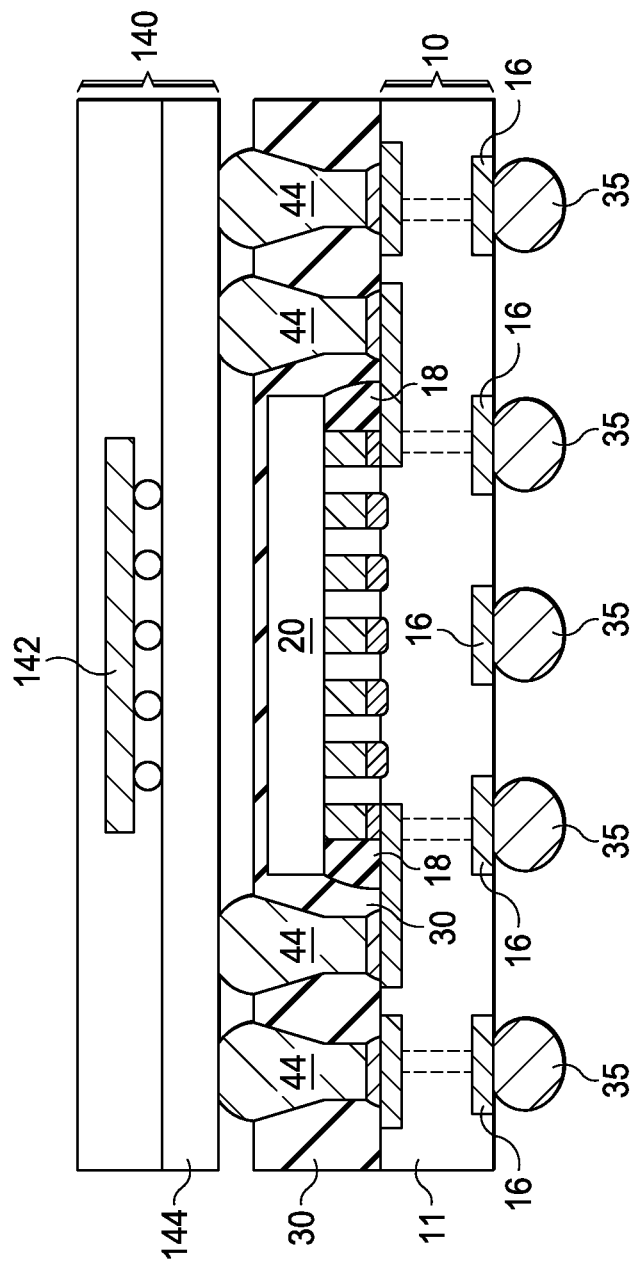
FIG. 10 illustrates a package-on-package structure resulted from the structure shown in FIG. 8.

FIG. 10 illustrates the PoP structure after the bonding of package components 40 (as shown in FIG. 8) and 140. It is observed that solder region 44 also follows the profile of openings 38, and have upper portions that have tapered profiles, and lower portions that have substantially vertical sidewalls.

By using the embodiments, the conventionally experienced solder damage is avoided. In the conventional formation process of through-molding vias, the through-molding openings were formed by performing laser drilling on cured molding compound. It was thus difficult to avoid the damage to the connectors that are meant to be exposed through the through-molding openings. In the embodiments, however, through-molding via openings are formed as the result of the removal of mold chase 24, and hence no damage to connectors 34 is involved. The through-molding via openings of the embodiments may be distinguished from conventional laser-drilled through-molding via openings since the sidewalls of through-molding via openings (such as 38 in FIG. 4) are smooth, with a surface roughness smaller than about 2 µm. As a comparison, the surface roughness of the through-molding via openings formed using the conventional laser drilling is greater than 2 µm, and may be about 2.7 µm in an example.

In accordance with embodiments, a method includes placing a mold chase over a bottom package, wherein the bottom package has a connector at a top surface of the bottom package. The mold chase includes a cover, and a pin under and connected to the cover. The pin occupies a space extending from a top surface of the connector to the cover. A polymer is filled into a space between the cover of the mold chase and the bottom package. The polymer is then cured. After the step of curing the polymer, the mold chase is removed, and the connector is exposed through an opening in the polymer, wherein the opening is left by the pin of the mold chase.

In accordance with other embodiments, a method includes placing a mold chase on a bottom package, wherein the bottom package includes a connector at a top surface of the bottom package. The mold chase has a pin, and a bottom surface of the pin is in contact with a top surface of connector. A molding compound is filled to over the bottom package and around sidewalls of the pin, and is then cured. The mold chase is removed to expose the top surface of the connector through an opening left by the pin. The opening extends from a top surface of the molding compound to the top surface of the connector.

In accordance with yet other embodiments, a device includes a package component comprising a connector at a top surface of the package component, a polymer over and in contact with the top surface of the package component; and an opening extending from a top surface of the polymer to at least a top surface of the connector. The top surface of the connector is exposed to the opening. The sidewalls of the opening have a roughness smaller than about 2 μm.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   placing a mold chase over a bottom package, wherein the bottom package comprises a connector at a top surface of the bottom package, wherein the mold chase comprises a cover, and a pin under and connected to the cover, wherein the pin occupies a space extending from a top surface of the connector to the cover, wherein the pin comprises:
      an upper portion having a tapered profile, and wherein from a top to a bottom of the upper portion, widths of the upper portion gradually reduce; and
      a lower portion connected to the upper portion and having a substantially vertical sidewall;
   filling a polymer into a space between the cover of the mold chase and the bottom package;
   curing the polymer; and
   after the step of curing the polymer, removing the mold chase, wherein the connector is exposed through an opening in the polymer, and wherein the opening is left by the pin of the mold chase.

2. The method of claim 1, wherein no lower portion of the pin is wider than any upper portion of the pin.

3. The method of claim 1, wherein the pin is a hollow pin comprising a recess extending from a bottom surface of the pin up into the pin, and wherein during the step of filling the polymer and the step of curing the polymer, the connector extends into the recess, and is separated from the polymer by sidewalls of the pin.

4. The method of claim 1, wherein the bottom package comprises a package substrate, wherein the package substrate is comprised in a package substrate strip comprising a plurality of package substrates, and wherein during the step of filling the polymer, the polymer flows to contact more than one of the plurality of package substrates.

5. The method of claim 1 further comprising, after the step of removing the mold chase, bonding a top package to the bottom package, wherein an electrical connector is formed in the opening during the step of bonding, and wherein the electrical connector electrically couples the top package to the bottom package.

6. The method of claim 1, wherein during the filling the polymer and the curing the polymer, a bottom surface of the pin is in physical contact with the top surface of the connector.

7. A method comprising:
   placing a mold chase on a bottom package, wherein the bottom package comprises a connector at a top surface of the bottom package, wherein the mold chase comprises a pin, wherein a bottom surface of the pin is in contact with a top surface of connector, and wherein the pin comprises an upper portion having a slanted sidewall, and wherein from a top to a bottom of the upper portion, widths of the upper portion gradually reduce;
   filling a molding compound to cover the bottom package and around sidewalls of the pin;
   curing the molding compound; and
   removing the mold chase to expose the top surface of the connector through an opening left by the pin, wherein the opening extends from a top surface of the molding compound to the top surface of the connector.

8. The method of claim 7, wherein after the step of placing the mold chase on the bottom package, the pin extends from a cover of the mold chase to the top surface of the connector.

9. The method of claim 7, wherein the bottom package comprises a die bonded to the top surface of the bottom package, and wherein after the step of filling and the step of curing, the molding compound covers the die.

10. The method of claim 7, wherein the bottom package comprises a plurality of connectors at the top surface of the bottom package, and wherein the mold chase comprises a plurality of pins, with a bottom surface of each of the plurality of pins in contact with a top surface of one of the plurality of connectors.

11. The method of claim 7 further comprising, after the step of removing the mold chase, bonding a top package to the bottom package, wherein at least a portion of the connector is reflowed to form an electrical connector in the opening and electrically coupling the top package to the bottom package.

12. The method of claim 7, wherein the pin has a substantially straight sidewall, and wherein no lower portion of the pin is wider than any upper portion of the opening.

13. The method of claim 7, wherein the pin comprises a lower portion having a substantially vertical sidewall, wherein the lower portion is connected to the upper portion.

14. A method comprising:
placing a mold chase over a bottom package, wherein the bottom package comprises a connector at a top surface of the bottom package, wherein the mold chase comprises a cover, and a pin under and connected to the cover, wherein the pin occupies a space extending from a top surface of the connector to the cover, and wherein the pin is a hollow pin comprising a recess extending from a bottom surface of the pin up into the pin;
filling a polymer into a space between the cover of the mold chase and the bottom package;
curing the polymer, wherein during the step of filling the polymer and the step of curing the polymer, the connector extends into the recess, wherein the connector is separated from the polymer by sidewalls of the pin; and
after the step of curing the polymer, removing the mold chase, wherein the connector is exposed through an opening in the polymer, and wherein the opening is left by the pin of the mold chase.

15. The method of claim 14, wherein the pin has a substantially straight sidewall, and wherein no lower portion of the pin is wider than any upper portion of the pin.

16. The method of claim 14, wherein the pin comprises:
an upper portion having a tapered profile, and wherein from a top to a bottom of the upper portion, widths of the upper portion gradually reduce; and
a lower portion connected to the upper portion and having a substantially vertical sidewall.

17. The method of claim 14, wherein the bottom package comprises a package substrate, wherein the package substrate is comprised in a package substrate strip comprising a plurality of package substrates, and wherein during the step of filling the polymer, the polymer flows to contact more than one of the plurality of package substrates.

18. The method of claim 14 further comprising, after the step of removing the mold chase, bonding a top package to the bottom package, wherein an electrical connector is formed in the opening during the step of bonding, and wherein the electrical connector electrically couples the top package to the bottom package.

* * * * *